(12) United States Patent
Li

(10) Patent No.: US 10,672,960 B2
(45) Date of Patent: Jun. 2, 2020

(54) LIGHT EMITTING DEVICE PACKAGE WITH A COATING LAYER

(71) Applicant: Lumileds LLC, San Jose, CA (US)

(72) Inventor: Shu Li, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/788,347

(22) Filed: Oct. 19, 2017

(65) Prior Publication Data

US 2019/0123250 A1 Apr. 25, 2019

(51) Int. Cl.
| | | |
|---|---|---|
| *H01L 33/00* | (2010.01) | |
| *H01L 33/60* | (2010.01) | |
| *H01L 33/62* | (2010.01) | |
| *H01L 33/56* | (2010.01) | |
| *H01L 33/48* | (2010.01) | |
| *H01L 33/44* | (2010.01) | |

(52) U.S. Cl.
CPC .............. *H01L 33/60* (2013.01); *H01L 33/56* (2013.01); *H01L 33/62* (2013.01); *H01L 33/44* (2013.01); *H01L 33/486* (2013.01); *H01L 2933/005* (2013.01); *H01L 2933/0058* (2013.01)

(58) Field of Classification Search
CPC ......... H01L 33/60; H01L 33/56; H01L 33/62; H01L 2933/0058; H01L 2933/005
See application file for complete search history.

(56) References Cited

U.S. PATENT DOCUMENTS

| | | | |
|---|---|---|---|
| 5,859,387 A | 1/1999 | Gagnon | |
| 7,736,920 B1 | 6/2010 | Wu et al. | |
| 10,153,416 B1* | 12/2018 | Tran | ............. H01L 33/465 |
| 10,211,380 B2* | 2/2019 | Lin | ............. H01L 33/60 |
| 2004/0061433 A1 | 4/2004 | Izuno et al. | |
| 2010/0102344 A1* | 4/2010 | Ueji | ............. H01L 33/507 |
| | | | 257/98 |
| 2010/0155021 A1* | 6/2010 | Chiang | ............. H01L 33/645 |
| | | | 165/80.2 |
| 2010/0193822 A1 | 8/2010 | Inobe et al. | |
| 2011/0284897 A1* | 11/2011 | Takayama | ............. H01L 33/486 |
| | | | 257/98 |
| 2012/0012876 A1* | 1/2012 | Katoh | ............. H01L 33/44 |
| | | | 257/98 |
| 2012/0074445 A1* | 3/2012 | Shimonishi | ............. H01L 33/60 |
| | | | 257/98 |
| 2013/0033870 A1 | 2/2013 | Suehiro et al. | |
| 2013/0200420 A1 | 8/2013 | Hussell | |

(Continued)

OTHER PUBLICATIONS

Hitachi Chemical, "CEL-W Series—White Epoxy Molding Compounds for LED Reflector", Available at http://www.hitachi-chem.co.jp/english/products/other/002.html, Retrieved from https://web.archive.org/web/20170906003044/http://www.hitachi-chem.co.jp/english/products/other/0020.html (Sep. 6, 2017).

(Continued)

*Primary Examiner* — Ismail A Muse
(74) *Attorney, Agent, or Firm* — Volpe and Koenig, P.C.

(57) ABSTRACT

A light-emitting device is disclosed. The light emitting device includes a base, a reflective layer formed on the base, a coating layer formed on the reflective layer, a sidewall disposed on the base, the sidewall being arranged to form a reflector cup, and a light-emitting diode (LED) chip disposed in the reflector cup.

12 Claims, 9 Drawing Sheets

(56) References Cited

U.S. PATENT DOCUMENTS

| | | | | |
|---|---|---|---|---|
| 2013/0341666 | A1* | 12/2013 | Yoshida | H01L 33/501 257/98 |
| 2014/0176646 | A1* | 6/2014 | Hirai | B41J 2/14233 347/71 |
| 2015/0162511 | A1* | 6/2015 | Washizu | H01L 33/60 257/98 |
| 2015/0171293 | A1 | 6/2015 | Higashiuchi et al. | |
| 2015/0280077 | A1* | 10/2015 | Wakaki | H01L 33/44 257/99 |
| 2015/0311392 | A1* | 10/2015 | Hirayama | H01L 33/32 257/13 |
| 2015/0353740 | A1* | 12/2015 | Kojima | F21V 19/001 362/296.04 |
| 2016/0027977 | A1* | 1/2016 | Seo | H01L 33/60 257/98 |
| 2018/0240376 | A1* | 8/2018 | Caironi | H01L 27/3227 |

OTHER PUBLICATIONS

Osram Opto Semiconductors, "Chemical Compatibility of LEDs", Application Note (Feb. 2015).
Osram Opto Semiconductors, "Preventing LED Failures Caused by Corrosive Materials", Application Note (Jun. 2013).

* cited by examiner

US 10,672,960 B2

LIGHT EMITTING DEVICE PACKAGE WITH A COATING LAYER

FIELD OF INVENTION

The present disclosure relates to light emitting devices in general, and more particularly, to a light emitting device package.

BACKGROUND

Light emitting diodes ("LEDs") are commonly used as light sources in various applications. The main functional part of an LED may be a semiconductor chip comprising two injecting layers of opposite conductivity types (p-type and n-type), and a light-emitting active layer for radiative recombination in which injection of carriers takes place. The semiconductor chip is usually placed in a package that provides electrical connections between the LED chip and the outside world, in addition to protection against vibration and mechanical shock.

LED packages can also play an important role in light collection. Specifically, LED packages can include a reflective layer formed underneath the packages' LED chip. The reflective layer may reflect light in one direction for increased luminous efficiency. However, reflective layers are often susceptible to corrosion due to exposure to moisture and corrosive small-molecule materials. When the reflective layer in an LED package is corroded, the light output efficiency of the LED package can be significantly reduced and the color of light produced by the LED package can change.

Accordingly the need exists for a new LED package design that protects reflective layers from corrosion due to exposure to moisture and/or other corrosive materials.

SUMMARY

The present disclosure addresses this need. According to one aspect of the disclosure, a light-emitting device is provided comprising: a base; a reflective layer formed on the base; a coating layer formed on the reflective layer; a sidewall disposed on the base, the sidewall being arranged to form a reflector cup; and a light-emitting diode (LED) chip disposed in the reflector cup.

According to another aspect of the disclosure, a light-emitting device is provided comprising: a base; a reflective layer formed on the base; a light-emitting diode (LED) chip coupled to the base via an adhesive layer; a sidewall disposed on the base, the sidewall surrounding the LED chip to form a reflector cup; and a coating layer formed on the reflective layer, wherein the coating layer is formed of an inorganic polymer and arranged to form a seal around the adhesive layer.

According to yet another aspect of the disclosure, a method for manufacturing a light-emitting device is provided, comprising: molding an electrically insulating compound onto a first lead frame and a second lead frame to form a base and a reflector cup, the first lead frame and the second lead frame each including a respective top surface that is plated with a reflective material to form a reflective layer of the base; mounting a light-emitting diode (LED) chip in the reflector cup, wherein the LED chip is mounted using an adhesive layer that is deposited onto the reflective layer; and forming a coating layer onto the reflective layer, wherein the coating layer is formed of an inorganic material and arranged to form a seal around the adhesive layer.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

Figure 5:
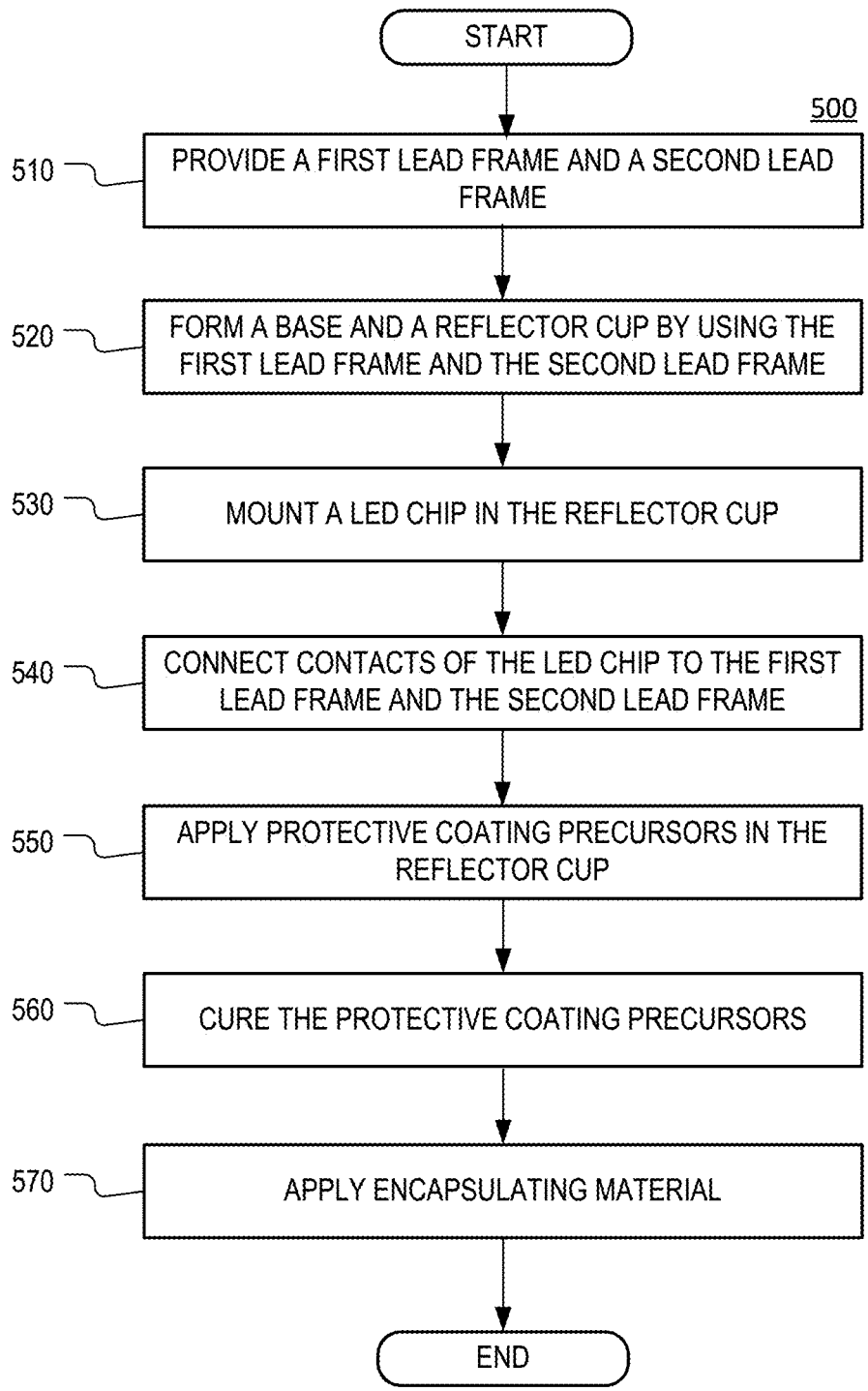
FIG. 5 is a flowchart of an example of a process for manufacturing an LED package, according to aspects of the disclosure.

6B is a schematic cross-sectional view of an example of an LED package assembly that is produced at a second stage of the process of FIG. 5, according to aspects of the disclosure;

6C is a schematic cross-sectional view of an example of an LED package assembly that is produced at a third stage of the process of FIG. 5, according to aspects of the disclosure;

6D is a schematic cross-sectional view of an example of an LED package assembly that is produced at a fourth stage of the process of FIG. 5, according to aspects of the disclosure;

6E is a schematic cross-sectional view of an example of an LED package assembly that is produced at a fifth stage of the process of FIG. 5, according to aspects of the disclosure;

6F is a schematic cross-sectional view of an example of an LED package assembly that is produced at a sixth stage of the process of FIG. 5, according to aspects of the disclosure; and 6G is a schematic cross-sectional view of a final LED package that is produced at the last stage of the process of FIG. 5, according to aspects of the disclosure.

DETAILED DESCRIPTION

According to aspects of the disclosure, a solid-state lighting package (hereinafter "LED package") is disclosed that includes a reflective layer and a coating layer. The coating layer is formed on the reflective layer to protect it from corrosion. The coating layer may be formed of an inorganic material. Using an inorganic material for the coating layer may be advantageous as inorganic materials are less prone than organic materials to yellowing and other types of damage caused by exposure to light.

According to aspects of the disclosure, the LED package may include a sidewall surrounding a light-emitting diode (LED) chip to define a reflector cup. The sidewall may be formed above the reflective layer and meet with the reflective layer. The point of contact between the sidewall and the reflective layer may be referred to as an "interface." The interface between the sidewall and the reflective layer may be to some extent permeable to moisture and/or other small-molecule corrosive materials. In this regard, the coating layer may be arranged to seal the interface, and thus prevent moisture and/or other corrosive materials from entering the reflector cup through the interface.

According to aspects of the disclosure, the LED chip may be bonded to the bottom of the reflector cup using an adhesive. The coating layer may cover, at least in part, the sidewalls of the LED chip, thus sealing off the adhesive from the rest of the reflector cup. As a result, the coating layer may isolate the adhesive from moisture and/or other corrosive materials that are present in the reflector cup, thus reducing the likelihood of chip-attach failure.

Examples of different LED implementations will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Figure 1A:
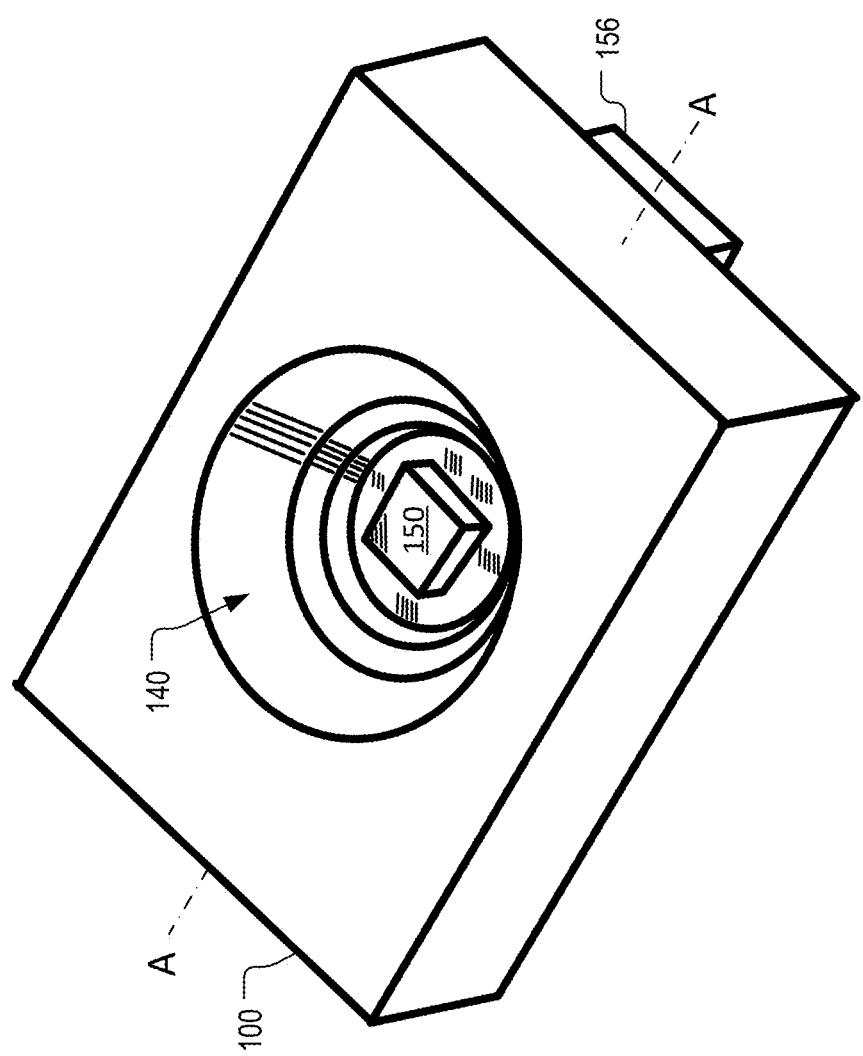
FIG. 1A is a schematic perspective view of an example of an LED package, according to aspects of the disclosure.
Figure 1B:
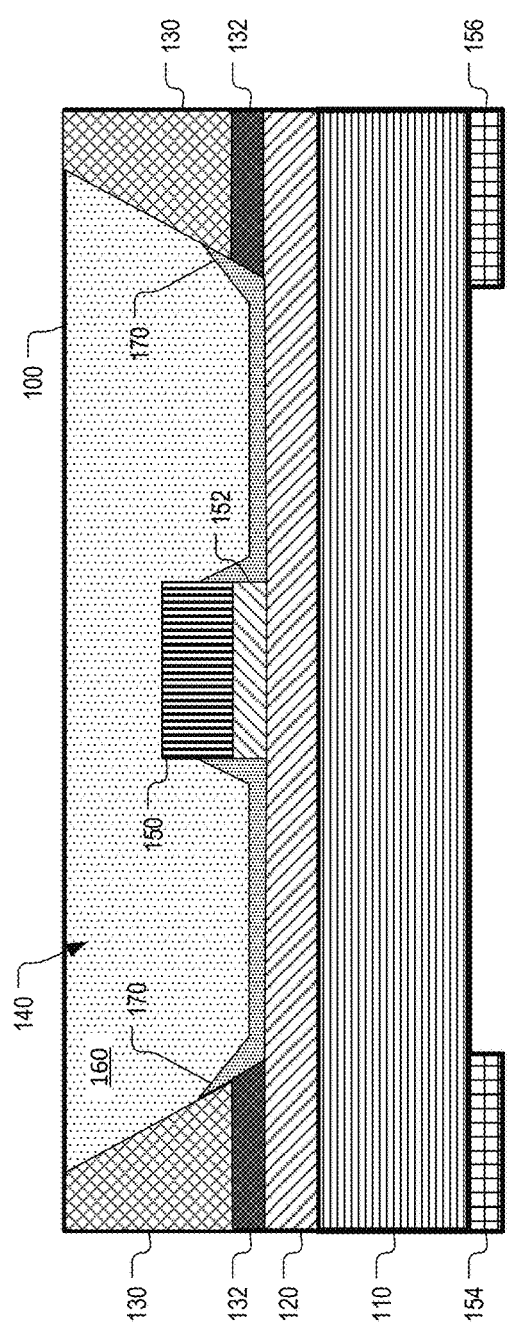
FIG. 1B is a schematic cross-sectional view of the LED package of FIG. 1A, according to aspects of the disclosure.
Figure 1C:
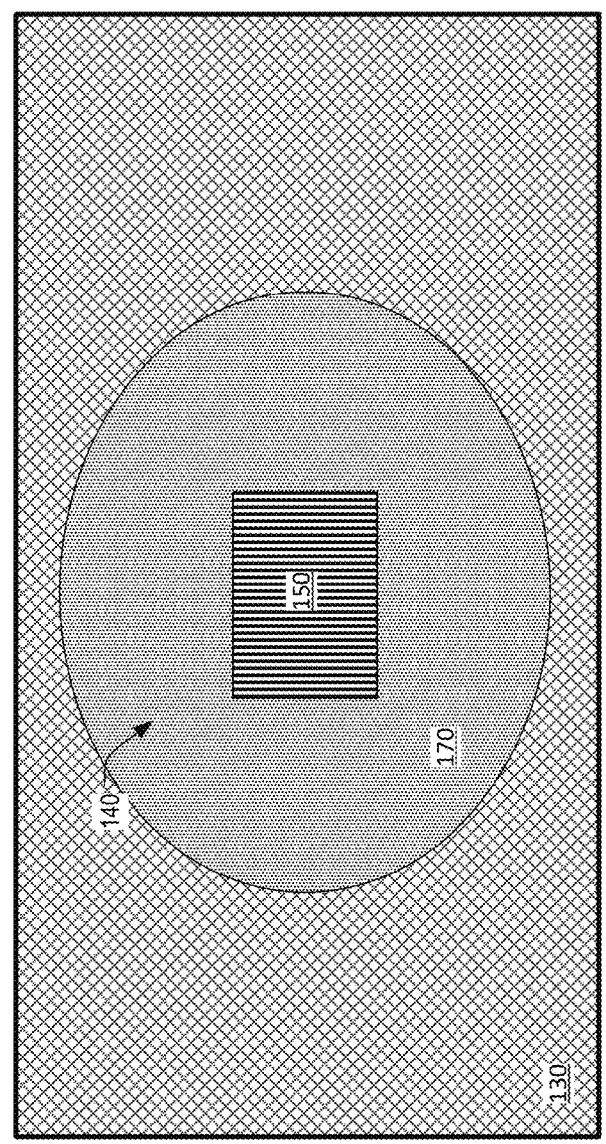
FIG. 1C is a top-down view of the LED package of FIG. 1A, according to aspects of the disclosure.

FIG. 1A is a schematic perspective view of a LED package 100, according to aspects of the disclosure. FIG. 1B is a schematic cross-sectional view of the LED package 100 taken along axis A-A. FIG. 1C is a top-down view of the LED package 100, according to aspects of the disclosure. The encapsulating compound 160, which is described further below, is omitted from FIGS. 1A and 1C in order to reveal elements beneath it.

As illustrated, the LED package 100 includes a base 110 having a reflective layer 120 formed thereon that is at least partially covered by a coating layer 170. A sidewall 130 is formed above the reflective layer to define a reflector cup 140. An LED chip 150 is disposed inside the reflector cup 140. The ohmic contacts of the LED chip 150 (not shown) are electrically coupled to leads 154 and 156, respectively. After the LED chip 150 is placed in the reflector cup 140, the reflector cup 140 is filled with an encapsulating compound 160.

The base 110 may be formed of many different materials, including electrically insulating materials and/or electrically conductive materials. For example, the base 110 may comprise a ceramic such as alumina, aluminum nitride, silicon carbide, or a polymeric material such as polyimide and polyester, etc. Additionally or alternatively, the base may include at least one lead frame. Additionally or alternatively, the base 110 may include a plurality of lead frames that are coupled with a non-conductive polymer material. Leads 154 and 156 can be provided on the bottom of the base 110 or another suitable location, such as the sides of the base 110. The leads 154 and 156 may be electrically coupled to the ohmic contacts of the LED chip 150 (not shown), thus providing an interface for connecting the LED chip 150 to various types of electronic circuitry.

The reflective layer 120 is formed above the base 110 to reflect light emitted by the LED chip 150 in an upward direction to increase the luminous efficacy of the LED package 100. In the present example, the reflective layer 120 is formed of silver (Ag). However, alternative implementations are possible in which the reflective layer includes another highly reflective material. Additionally or alternatively, the reflective layer 120 may include a combination of materials. For example, the reflective layer 120 may include one highly reflective material and another material having a high index of refraction. Thus, in addition to improving the luminous efficiency of the LED package 100, the reflective layer 120 may be used to further shape the optical characteristics of light emitted from the LED package 100.

The reflector cup 140 is shaped as the frustum of a cone, in the present example. However, alternative implementations are possible in which the reflector cup 140 has a different shape (e.g., cylindrical shape, cuboid shape, etc.). In this regard, the present disclosure is not limited to any particular shape and/or physical dimensions for the reflector cup. Although in the present example the sidewall 130 is taller than the LED chip 150, in some implementations, the sidewall 130 of the reflector cup 140 may be shorter than the LED chip 150, such that the light-emitting surface of the LED chip is positioned above the top of the sidewall 130. Although in the present example the sidewall 130 fully surrounds the LED chip 150, alternative implementations are possible in which the sidewall 130 only partially surrounds the LED chip 150 or does not surround it all. Accordingly, as used throughout the disclosure, the term "reflector cup" may refer to any functional area of the LED package 100 where the LED chip 150 is installed.

In some implementations, the sidewall may be formed of a metallic material and bonded to the base 110 by means of a solder or epoxy bond. Additionally or alternatively, in some implementations, the sidewall 130 may be formed of a resin, such as epoxy resin or thermoplastic resin. Additionally or alternatively, in some implementations, the sidewall 130 may be integral with the base 110. Additionally or alternatively, in some implementations, the sidewall 130 may be etched onto the base 110. Additionally or alternatively, in some implementations, the sidewall 130 may be molded onto the base 110.

The LED chip 150 is disposed at the center of the reflector cup 140 to obtain uniform light distribution characteristics. The LED chip 150 may be any suitable type of semiconductor light emitting device. The LED chip 150 may be provided with contacts (e.g., an anode contact and a cathode contact) that are electrically connected to the leads 154 and 156, respectively. The electrical connection may be formed by using bond wires, attach pads, and/or any suitable type of conductor. Although in the present example only one LED chip 150 is placed in the reflector cup 140, alternative implementations are possible in which multiple LED chips are disposed within the reflector cup 140. For example, different color LEDs can be placed in the reflector cup 140 to achieve a light output of varying color. Each LED chip that is placed in the reflector cup 140 may be connected to a different set of leads.

The encapsulating compound 160 may be injected into the reflector cup 140 to protect the LED chip 150 from damage, as shown. The encapsulating compound may include a silicon resin, an epoxy resin, and/or any other suitable type of material. In some implementations, a desired emission color may be obtained by mixing phosphorous into the encapsulating compound.

The coating layer 170 is formed above the reflective layer 120 to protect it from corrosion. In some implementations, the coating layer may be transparent or reflective in the visible light range (360-850 nm) and it may have a refractive index in the range of 1.40-1.80. Additionally or alternatively, in some implementations, the coating layer 170 may have a thickness in the range of 40 nm to 20 μm.

The coating layer may be formed of any suitable type of inorganic material. For example, and without limitation, the coating layer may be formed of an inorganic material selected from the group including a Si—O material, a Si—O—N material, an Al—O material, an Al—N material, a Si—N material, and a Ti—O material. Additionally or alternatively, the coating layer may be formed of any suitable type of organic material. For example, the coating layer may be formed of an organic material selected from the group including a Si—C material and a Si—C—N material. Using an inorganic material to form the coating layer 170 may be advantageous as organic materials, when exposed to light, may release gasses that are damaging to the reflective layer 120. This may be especially so when the reflective layer 120 is includes silver and/or a silver-based material. Additionally or alternatively, in some implementations, the coating layer may include a stack including one or more of a Si—O material, a Si—O—N material, an Al—O material, an Al—N material, a Si—N material, and a Ti—O material. Additionally or alternatively, in some implementations, the coating layer may include an alternating stack comprising at least two of a Si—O material, a Si—O—N material, an Al—O material, an Al—N material, a Si—N material, and a Ti—O material. Additionally or alternatively, in some implementations, the coating layer may be a stack (e.g., an alternating stack) comprising only inorganic materials. Additionally or alternatively, in some implementations, the coating layer may include a stack comprising organic materials, such as a Si—C material and a Si—C—N material.

In the present example, the reflective layer 120 is introduced before the sidewall 130 is formed. As a result, the reflective layer 120 extends underneath the sidewall 130 and meets with the sidewall 130 at an interface 132, the interface 132 being the point of contact between the reflective layer 120 (or the base 110) and the sidewall 130. The contact may be either direct or indirect. That is, there may or may not be other layers/elements present at the interface 132, such as adhesives, additional layers, etc. The relative size of the interface 132 is grossly exaggerated in the figures to achieve greater clarity of illustration.

The interface 132 may be permeable to moisture and other small-molecule materials that can damage the reflective layer 120 and cause the LED package 100 to fail. To address this vulnerability, the coating layer 170 may be configured to seal the interface 132. For example, the coating layer 170 may be arranged to have a thickness that is greater than the thickness of the interface 132. As another example, the coating layer 170 may be configured to extend up the sidewall 130, as shown, and seal the interface 132 this way. Accordingly, in some aspects, forming the coating layer 170 above the reflective layer 120 may be advantageous as the coating layer 170 may prevent (or reduce) the entry of moisture and other small-molecule materials through the interface between the sidewall 130 and elements below it.

In the present example, the LED chip 150 may be bonded to the bottom of the reflector cup 140 using an adhesive 152. The adhesive 152 may include a solder adhesive, a non-conducting epoxy adhesive, and/or any other suitable type of adhesive material. In some implementations, the adhesive 152 may include a non-conductive adhesive that is used to bond the LED chip 150 to the base 110. Additionally or alternatively, in some implementations, the adhesive 152 may include a solder adhesive that is used to bond contacts of the LED chip 150 to underlying attach pads in order to connect the leads 154-156 to the contacts of the LED chip 150. Additionally or alternatively, in some instances, the adhesive 152 may include both a solder adhesive that is used to bond the ohmic contacts of the LED chip 150 to underlying attach pads (e.g., see FIG. 5) and a non-conductive underfill element used to further bolster the bond between the LED chip 150 and the base 110.

In some aspects, the adhesive 152 may be vulnerable to damage from moisture and/or other materials that find their way in the reflector cup 140. To address this vulnerability, the coating layer 170 may be arranged to seal off (either completely or partially) the adhesive 152 from the rest of the reflector cup 140. For example, the coating layer 170 may be arranged to have a thickness that is greater than the thickness of the layer formed by adhesive 152. As another example, the coating layer 170 may be configured to extend up the sidewall(s) of the LED chip 150 as shown. As a result, the coating layer 170 may cover one or more sidewalls of the LED chip 150, either partially or substantially, and seal off the adhesive 152 this way. Forming the coating layer 170 above the reflective layer 120 may be advantageous as the coating layer 170 may reduce the likelihood of chip-attach failure due to damage of the adhesive 152.

The portion of the coating layer 170 that covers the sidewall 130 may have a tapered cross-section, as shown, and/or any other suitable shape. In some implementations, the coating layer 170 may cover the entire face of the sidewall 130 that is oriented towards the LED chip 150. Alternatively, in some implementations, the coating layer 170 may cover only a portion of the entire face of the sidewall 130 that is oriented towards the LED chip 150. Thus, the present disclosure is not limited to any particular degree of coverage of the sidewall 130 by the coating layer 170.

In some implementations, the coating layer 170 may cover all (four) sides of the LED chip 150, as shown. The portion of the coating layer 170 that covers any particular side of the LED chip 150 may have a tapered cross-section, and/or any other suitable shape. In the present example, the LED chip has a bottom surface, which is coupled to the base 110, a top surface (e.g., light emitting surface) that is substantially parallel to the bottom surface and outwardly facing. The sides of the LED chip 150 are thus the surfaces that extend between the top surface and the bottom surface. In the present example, the sides of the LED chip 150 connect to the top and bottom surfaces at a right angle, however alternative implementations are possible in which the LED chip 150 has tapered sides.

Although in the present example each of the four sides of the LED chip is only partially covered by the LED chip 150, alternative implementations are possible in which one or more sides of the LED chip 150 are substantially covered by the coating layer 170. In this regard, a side of the LED chip 150 may be substantially covered by the coating layer 170, if the coating layer 170 is deposited over more than eighty percent of the surface of that side (e.g., deposited over 98% or more, deposited over 95% or more, deposited over 90% or more, deposited over 85% or more, etc.). Stated succinctly, the present disclosure is not limited to any particular degree of coverage of the sides of the LED chip 150 by the coating layer 170.

As noted above, in the present example, the reflective layer 120 is introduced before the sidewall 130 is formed. However, alternative implementations are possible in which the reflective layer 120 is formed after the sidewall 130 is provided. In such instances, the reflective will not extend underneath the sidewall 130, but the coating layer 170 may still be configured to seal any gap that there might be between the sidewall 130 and the base 110 (or another layer/element formed between the base 110 and the sidewall 130).

Furthermore, in the present example, the reflective layer 120 is formed before the LED chip 150 is mounted in the reflector cup 140. However, alternative implementations are possible in which the reflective layer 120 is formed after the LED chip 150 is installed in the reflector cup 140. In such instances, the reflective layer 120 may surround the LED chip 150 without extending underneath it.

Figure 1D:
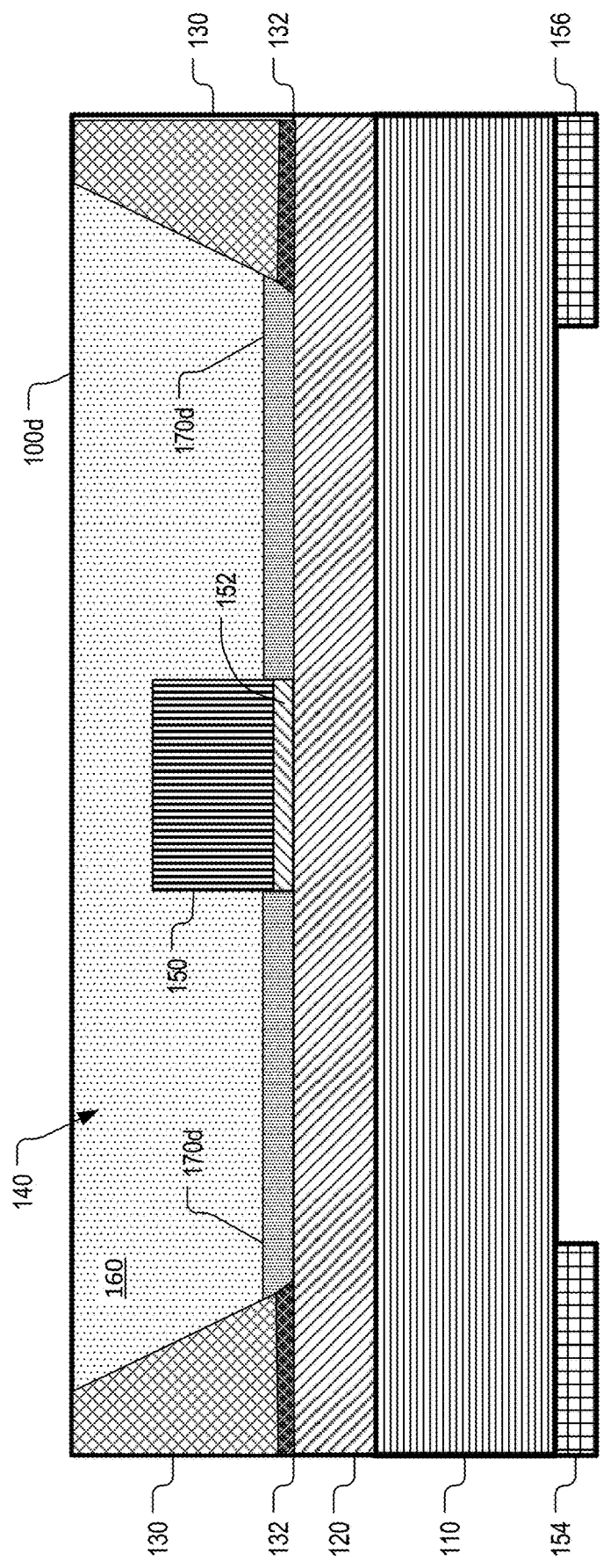
FIG. 1D is a schematic cross-sectional view of another example of an LED package, according to aspects of the disclosure.

FIG. 1D is a schematic cross-sectional view of a LED package 100d, which includes a coating layer 170d. The coating layer 170d may have the same composition, refractive index, and/or thickness as the coating layer 170. However, unlike the coating layer 170, the coating layer 170d does not cover the sides of the LED chip 150 as any contact between the coating layer 170d and the sides of the LED chip is incidental to the coating layer 170d being deposited adjacently to the LED chip to form a substantially flat shape. Similarly, in the example of FIG. 1D, the coating layer 170d does not cover the face of the sidewall 130 that is oriented towards the LED chip 150, as any contact between the coating layer 170d and the sidewall 130 is incidental to the coating layer 170d being deposited adjacently to the LED chip to form a substantially flat shape.

This is in contrast to the coating layer 170, which at least partially covers the sidewall 130 and the walls of the LED chip 150. To achieve this effect, the coating layer 170 forms concave shape, that is open in the middle where the LED chip 150 is positioned, and whose respective edges conform, at least partially, to the geometry of the sidewall 130 and/or the geometry of the side(s) of the LED chip 150. Each of the respective edges of the concave shape may have a tapered cross-section, as shown, and it may extend over the sidewall 130 or the walls of the LED chip 150, as shown. Additionally or alternatively, each of the respective edges may be at angle relative to the base 110. In some aspects, the depth of the concave shape may be greater than the thickness of the coating layer 170 (e.g., at least 2 times greater, at least 5 times greater, at least 10 times greater, at least 100 times greater, etc.). The depth of the convex shape may be the distance between the end of one of its edges and the base 110. The thickness of the coating layer 170 may be what is conventionally referred to as the thickness of a layer. For example, the thickness of the coating layer 170 may be the distance between a first surface and a second surface of the coating layer, wherein both surfaces are substantially parallel to one another and to the plane of the base 110.

In some aspects, the process used to form the coating layer may determine whether it covers the sidewall 130 and/or the side(s) of the LED chip 150. For example, when vapor deposition is used to form the coating layer, the sides of the LED chip 150 may be left uncovered. By contrast, when liquid deposition is used to form the coating layer, one or more sides of the LED chip 150 may be at least partially covered by the coating layer. In the example of FIGS. 1A-D, the coating layer 170 is formed using liquid deposition, whereas the coating layer 170d is formed using vapor deposition.

Figures 2A, 2B:
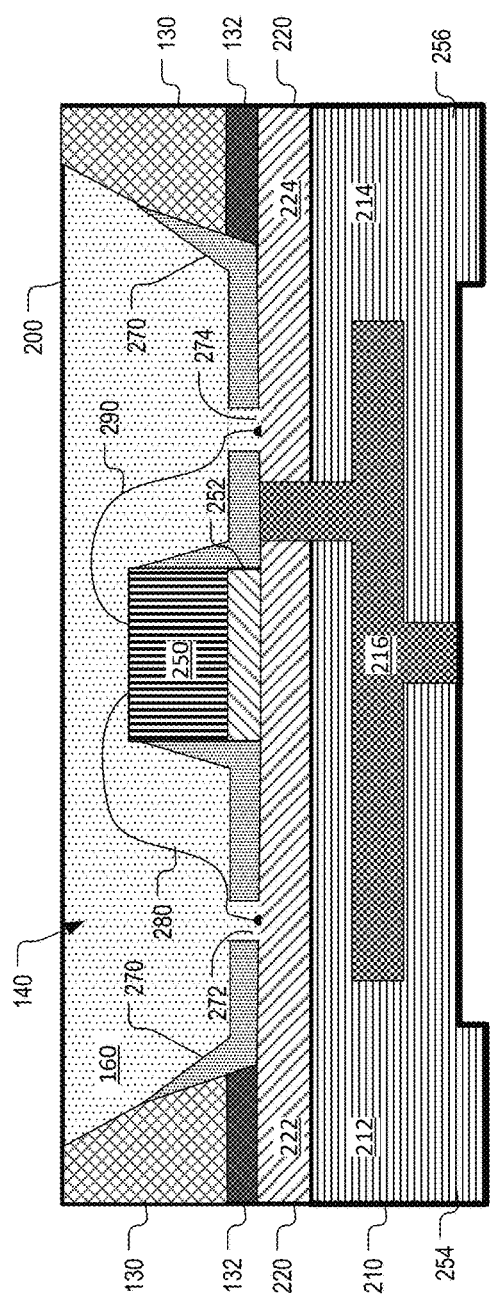
FIG. 2A is a schematic cross-sectional view of yet another example of an LED package, according to aspects of the disclosure.
FIG. 2B is a schematic top-down view of the LED package of FIG. 2A, according to aspects of the disclosure.

FIG. 2A is a schematic cross-sectional view of a LED package 200, according to aspects of the disclosure. FIG. 2B is a schematic top-down view of the LED package 200, according to aspects of the disclosure. The encapsulating compound 160 is omitted from FIG. 2B in order to reveal elements beneath it.

In the example of FIGS. 2A-B, a base 210 includes a first electrically conductive lead frame 212 that is coupled to a second electrically conductive lead frame 214 by an electrically non-conductive element 216. Leads 254 and 256 may be integrally formed on the first lead frame 212 and the second lead frame 214, respectively, to provide an interface between the LED chip 250 and the outside world. A reflective layer 220 is formed of silver and/or other conductive material(s) above the base 210. The reflective layer comprises a first portion 222 and a second portion 224. The first portion 222 and the second portion 224 are electrically insulated from one another by the non-conductive element 216. The non-conductive element 216 may be formed by molding a reflective polymer material onto the first lead frame 212 and the second lead frame 214. The first portion 222 and the second portion 224 of the reflective layer 220 may be formed by plating the lead frames 212 and 214 with silver prior to the reflective polymer material being molded onto them.

A coating layer 270 is formed above the reflective layer 220. The coating layer 270 may have the same thickness, refractive index, and/or composition as any of the coating layers 170 and 170d. However, unlike these coating layers, the coating layer 270 may be patterned to include openings 272 and 274 that expose the surface of the reflection layer 120 in order to permit bond wires 280 and 290 to be connected to the lead frames 212 and 214 (or the reflective layer portions 222 and 224), respectively. The openings 272 and 274 may be formed using any suitable type of masking and/or photolithographic technique.

In the example of FIGS. 2A-B, the coating layer 270 substantially covers at least one (and/or all) sides of the LED chip 250. As noted above, a side may be substantially covered by the coating layer 270, if the coating layer 270 is deposited over more than 80 percent of the surface of that side (e.g., deposited over 98% or more, deposited over 95% or more, deposited over 90% or more, deposited over 85% or more, etc.). Furthermore, according to aspects of the disclosure, the coating layer 270 may cover the side of the non-conductive element 216 that is flush with the top surface of the reflective layer 220. In this regard, the coating layer 270 may form a barrier between the non-conductive element 216 and the package components located in the reflector cup 140.

The LED chip 250 may be the same or similar to the LED chip 150 discussed with respect to FIGS. 1A-F. The LED chip 250 may be mounted on lead frame 212 using an adhesive 252, as shown. To facilitate secure installation of the LED chip 250, the lead frame 212 may be larger in size than the lead frame 214, as shown.

The cathode contact of the LED chip 250 (not shown) is coupled to the portion of the first lead frame 212, which is exposed through the opening 272, via bond wire 280. The anode contact of the LED chip 250 (not shown) is coupled to the portion of the second lead frame 214, which is exposed through the opening 274, via bond wire 290. In some implementations, the bond wires 280 and 290 may be soldered directly onto the reflective layer portions 222 and 224. Additionally or alternatively, in some implementations, the bond wires may be attached to the lead frames 212 and 214, respectively, via conductive traces that are provided on the reflective layer portions 222 and 224. Stated succinctly, the present disclosure is not limited to any specific technique for connecting the bond wires 280 and 290 to the base 210. In some aspects, the availability of the openings 272 and 274 permits the bond wires 280 and 290 to be installed after the coating layer 270 is formed.

Figure 3:
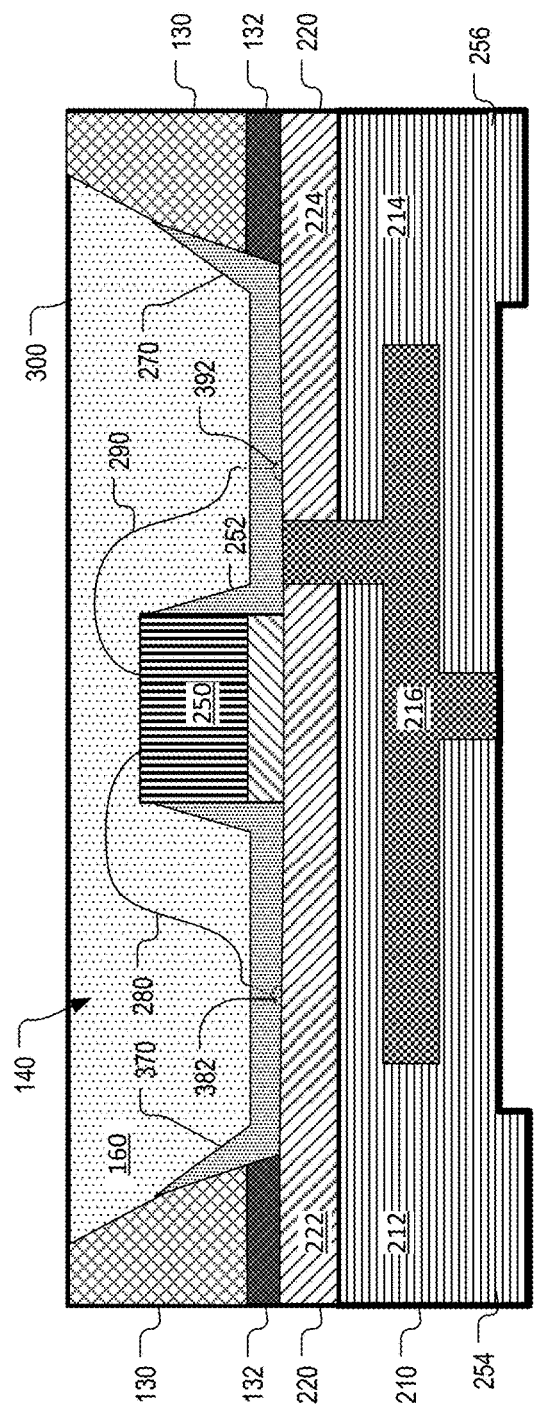
FIG. 3 is a schematic cross-sectional view of yet another example of an LED package, according to aspects of the disclosure.

FIG. 3 is a cross-sectional view of a LED package 300, according to aspects of the disclosure. The LED package 300 has a structure that is nearly identical to that of the LED package 200. However, unlike the LED package 200, the LED package 300 includes a coating layer 370 that is formed after the bond wires 280 and 290 are connected to the first lead frame 212 and the second lead frame 214, respectively. As a result, the coating layer 370 covers the point of contact 382 between the bond wire 280 and the first lead frame 212 (or reflective layer portion 222). Similarly, the coating layer 370 covers the point of contact 392 between the bond wire 290 and the second lead frame 214 (or reflective layer portion 224). Any of the point of contact 382 and the point of contact 392 may include one or more of the end of one of bond wires 280 and 290, a conductive adhesive, a solder bump, a conductive trace, and/or any other suitable type of connecting element. Covering the points of contact 382 and 392 with the coating layer 370 may further increase the reliability of the electrical connections between the LED chip 250 and the base 210.

Figure 4:
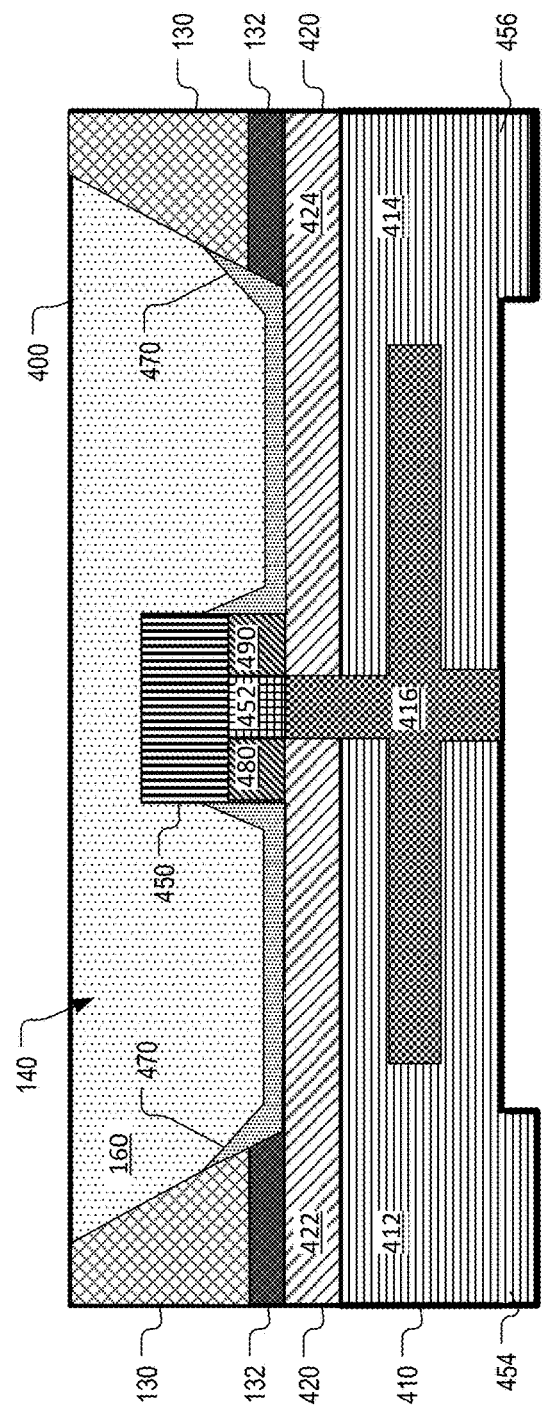
FIG. 4 is a schematic cross-sectional view of yet another example of an LED package, according to aspects of the disclosure.

FIG. 4 is a cross-sectional view of an example of a flip-chip LED package 400, according to aspects to the disclosure. The LED package 400 includes a base 410 comprising a first electrically conductive lead frame 412 that is coupled to a second electrically conductive frame 414 by an electrically non-conductive element 416. A reflective layer 420 is formed of silver and/or other conductive material(s) above the base 410. The reflective layer comprises a first portion 422 and a second portion 424. The first portion 422 and the second portion 424 are electrically insulated from one another by the non-conductive element 416. Leads 454 and 456 may be integrally formed on the bottom surfaces of lead frames 412 and 414 to provide means for connecting the LED package 400 to various types of electronic circuitry.

The LED chip 450 may be any suitable type of semiconductor light emitting device that features a flip-chip configuration. The first portion 422 of the reflective layer 420 is coupled to an attach pad 480 of an LED chip 450, and the second portion 424 of the reflective layer 420 is coupled to an attach pad 490 of the LED chip 450. A chip underfill element 452 may be injection molded between the attach pads 480 and 490 to strengthen the bond between the LED chip 450 and the base 410 and to electrically insulate the attach pads 480 and 490 from one another.

A coating layer 470 is formed above the reflective layer 420, as shown. In some implementations, the coating layer 470 may at least partially cover the walls of the LED chip 450. In some implementations, the coating layer may form a seal around the attach pads 480 and 490, as shown. As a result, the coating layer 470 may isolate the attach pads 480 and 490, as well as the underfill element 452, from the rest of the reflector cup 140. According to aspects of the disclosure, the coating layer 470 may have the same composition, thickness, and/or refractive index as the coating layer 170. Forming the coating layer 470 above the reflective layer 420 may be advantageous as the coating layer 470 may reduce the likelihood of chip-attach failure.

Figure 6A:
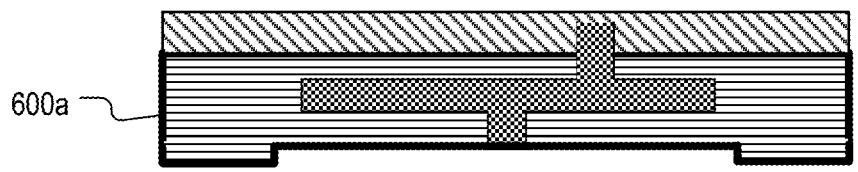
FIG. 6A is a schematic cross-sectional view of an example of an LED package assembly that is produced at a first stage of the process of FIG. 5, according to aspects of the disclosure.

FIG. 5 is a flowchart of an example of a process 500, for manufacturing a LED package, according to aspects of the disclosure. According to the process, at step 510, a first lead frame and a second lead frame are provided. Both lead frames may be plated with silver or another reflective material. Furthermore, both frames may be joined to together by a molding compound to produce the assembly 600a, which is shown in FIG. 6A.

Figure 6B:
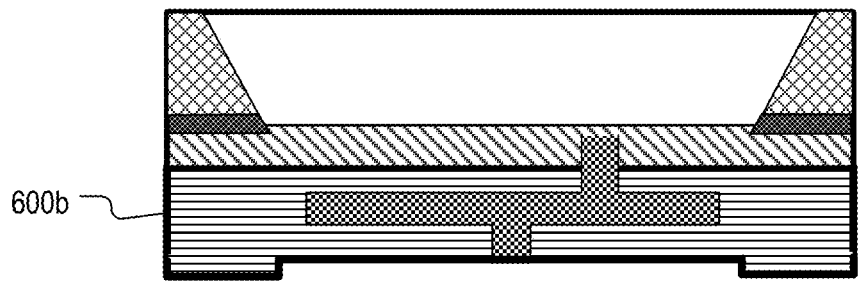

At step 520, a reflective polymer material is molded over the lead frames to form a base and a reflector cup. As a result, the assembly 600b is produced, which is shown in FIG. 6B. According to aspects of the disclosure, the reflector cup may be formed by using any suitable type of process. For example, in some implementations, the reflector cup may be formed by injection molding or another similar process. Furthermore, in some implementations, the reflector cup may be trimmed after it is molded to achieve a desired shape for the reflector cup.

Figure 6C:
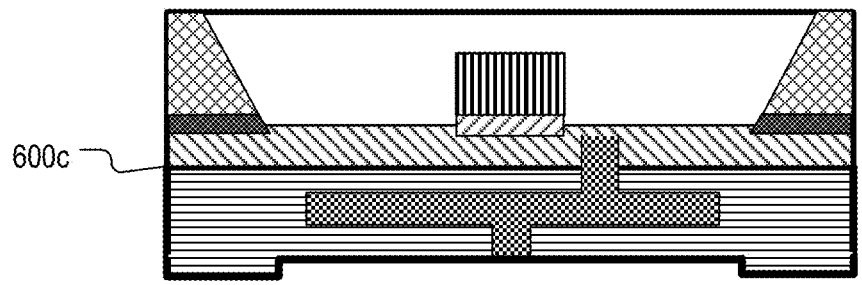

At step 530, an LED chip is placed in the reflector cup and attached to one of the lead frames that form the base. As a result of performing step 530, the assembly 600c is produced, which is shown in FIG. 6C.

Figure 6D:
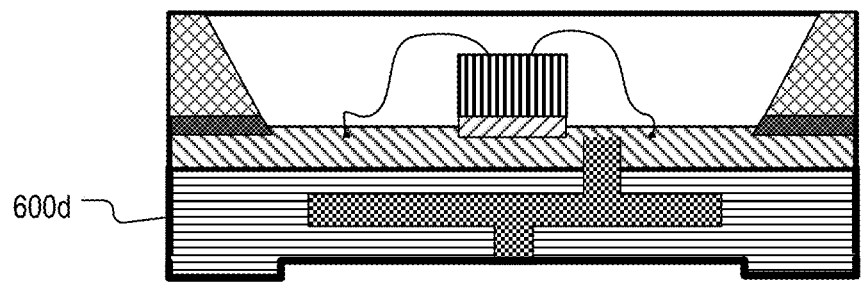

At step 540, wire bonds are attached to the contacts of the LED chip and the lead frames designated for anode and cathode respectively. As a result of performing step 540, the assembly 600d is produced, which is shown in FIG. 6D.

Figure 6E:
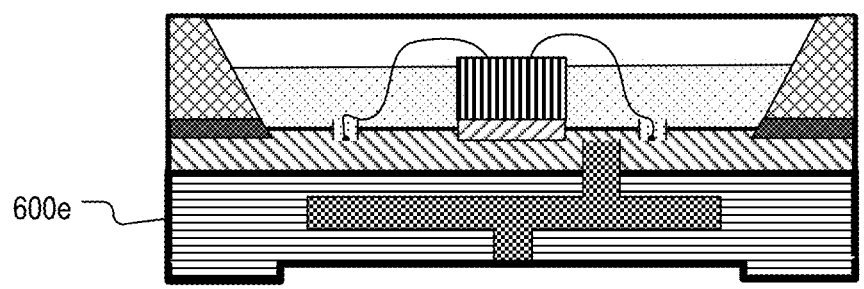

At step 550, a liquid solution material, containing precursors, is applied in the reflector cup formed in step 520. The liquid solution material may be applied by dispensing, spraying, spin coating, and/or any other suitable technique. The liquid solution material may be dispensed in adequate quantity to form the final coating layer over the silver plating of the lead frames, and partly (or substantially) over the sidewalls of the reflector cup, and the LED chip. As a result of performing step 550, the assembly 600e is produced, which is shown in FIG. 6E.

Figure 6F:
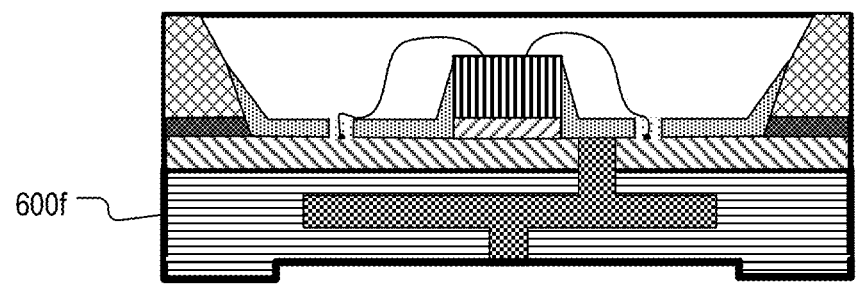

At step 560, the entire package produced so far (e.g., the assembly 600e), together with the attached LED chip, bond wire, and dispensed liquid solution, is heated to a first temperature to drive off solvent that is part of the liquid solution material, so that cross-link chemical reactions can start to take place. The package may continue to be heated at the first temperature until ninety percent (90%) of more of the solvent in the solution is driven off. Afterwards, the entire package is taken to a higher temperature for complete conversion of the precursor materials to the final layer with high density and low permeability to water vapor and many other small molecule gaseous materials. Upon the final conversion of the precursor materials, a thin, transparent, and highly durable layer of coating is formed on the reflective plating, and partly over side wall of the reflector cup, and the LED chip. In some aspects, the layer may be similar to one or more of the coating layers discussed with respect to FIGS. 1A-4 (e.g., the layers 170, 170d, 270, 370, and 470). As a result of performing step 560, the assembly 600f is produced, which is shown in FIG. 6F.

Figure 6G:
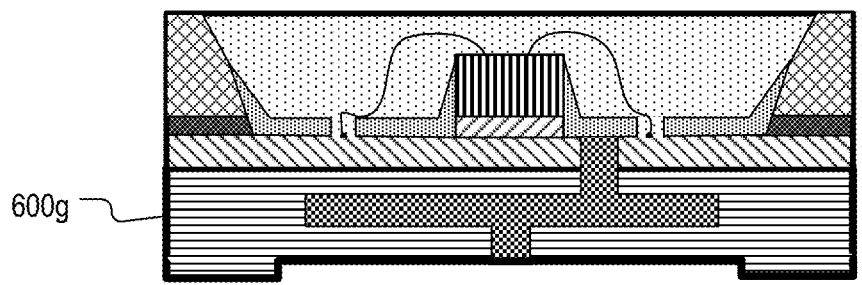

At step 570, an encapsulating material, with or without wavelength converting components is applied in the reflector cup, followed by a subsequent curing of the encapsulating material. As a result of performing step 570, a final LED package 600g is produced, which is shown in FIG. 6G.

FIGS. 1A-6G are provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A light emitting device comprising:
a reflective layer on a base;
a sidewall on the reflective layer defining a reflector cup;
a light emitting diode (LED) within the reflector cup and on the reflective layer;
a transparent coating layer on the reflective layer and at least a portion of the sidewall, the transparent coating layer surrounding at least a portion of the LED;
an opening in the transparent coating layer exposing a portion of the reflective layer; and
a conductive element connecting the LED to the exposed portion of the reflective layer, the conductive element electrically coupling the LED to the base.

2. The light emitting device of claim 1, wherein the LED is bonded to the base via an adhesive layer.

3. The light emitting device of claim 1, wherein:
the sidewall meets the reflective layer at an interface; and
the transparent coating layer has a thickness greater than a thickness of the interface to seal the interface.

4. The light emitting device of claim 1, wherein the transparent coating layer comprises one or more of a Si—O material, a Si—O—N material, an Al—O material, an Al—N material, a Si—N material, and a Ti—O material.

5. The light emitting device of claim 1, wherein the transparent coating layer has a refractive index in a range of 1.40-1.80.

6. The light emitting device of claim 1, wherein the transparent coating layer has a thickness ranging from 40 nm to 20 µm.

7. A method for manufacturing a light emitting device, comprising:
molding an electrically insulating compound onto a first lead frame and a second lead frame to form a base including a reflector cup, the first lead frame and the second lead frame each including a respective first surface that is plated with a reflective material to form a reflective layer of the base;
depositing an adhesive layer onto the reflective layer;
mounting a light-emitting diode (LED) chip in the reflector cup via the adhesive layer;
forming a transparent coating layer on the reflective layer; and
forming an opening in the transparent coating layer to expose a portion of the reflective layer.

8. The method of claim 7, wherein the forming the transparent coating layer comprises using a liquid deposition to deposit the transparent coating layer on the reflective layer.

9. The method of claim 7, wherein the transparent coating layer is formed of an inorganic material selected from the group consisting of a Si—O material, a Si—O—N material, an Al—O material, an Al—N material, a Si—N material, and a Ti—O material.

10. The method of claim 7, wherein the transparent coating layer has a refractive index in a range of 1.40-1.80 and a thickness in a range of 40 nm to 20 µm.

11. The light emitting device of claim 2, wherein the transparent coating layer forms a seal around the adhesive layer.

12. The method of claim 7 further comprising:
connecting the LED chip to the base by a conductive element through the portion of the reflective layer exposed by the opening in the transparent coating layer.

* * * * *